United States Patent
Nakamura et al.

(10) Patent No.: US 6,545,474 B2
(45) Date of Patent: Apr. 8, 2003

(54) CONTROLLING METHOD OF SUPERCONDUCTOR MAGNETIC FIELD APPLICATION APPARATUS, AND NUCLEAR MAGNETIC RESONANCE APPARATUS AND SUPERCONDUCTING MAGNET APPARATUS USING THE METHOD

(75) Inventors: Takashi Nakamura, Wako (JP); Jun Uzawa, Wako (JP); Tetsuo Oka, Obu (JP); Yoshitaka Ito, Chiryu (JP); Yousuke Yanagi, Chiryu (JP); Masaaki Yoshikawa, Kariya (JP); Ryohei Yabuno, Toyota (JP)

(73) Assignees: Riken (JP); Aisin Seiki Kabushiki Kaisha (JP)

( * ) Notice: Subject to any disclaimer, the term of this patent is extended or adjusted under 35 U.S.C. 154(b) by 0 days.

(21) Appl. No.: 09/888,538

(22) Filed: Jun. 26, 2001

(65) Prior Publication Data
US 2002/0000807 A1 Jan. 3, 2002

(30) Foreign Application Priority Data
Jun. 26, 2000 (JP) ........................................ 2000-191265

(51) Int. Cl.$^7$ ................................................. G01V 3/00
(52) U.S. Cl. .................... 324/318; 324/315; 324/307
(58) Field of Search ................. 324/318, 319, 324/315, 320, 321, 307, 309, 300

(56) References Cited

U.S. PATENT DOCUMENTS 5,508,613 A * 4/1996 Kotsubo et al. ............ 324/318
5,684,401 A * 11/1997 Peck et al. .................. 324/318
5,689,187 A * 11/1997 Marec et al. ................ 324/318
6,054,855 A * 4/2000 Anderson ................... 324/318

FOREIGN PATENT DOCUMENTS

| JP | 09-135823 A | 5/1997 |
| JP | 11-248810 A | 9/1999 |

* cited by examiner

Primary Examiner—Edward Lefkowitz
Assistant Examiner—Brij B. Shrivastav
(74) Attorney, Agent, or Firm—Griffin & Szipl, P.C.

(57) ABSTRACT

A controlling method for a nuclear magnetic resonance apparatus. The method includes: (A) cooling the high-temperature superconductor at a magnetization low temperature sufficiently lower than a superconductor transition temperature, and magnetizing the high-temperature superconductor with a magnetic field; (B) raising the temperature of the high-temperature superconductor at a magnetic flux setting temperature higher than the magnetization low temperature and lower than the superconductor transition temperature and setting a predetermined magnetic flux density; and (C) controlling the high-temperature superconductor in an operation temperature range lower than the magnetic flux setting temperature. Therefore, a strong static magnetic field comparable to a conventional superconducting magnet is formed without using a refrigerant (liquid helium) essential for operating the conventional superconducting magnet, and a magnetic flux density of the static magnetic field is held constant.

21 Claims, 6 Drawing Sheets

CONTROLLING METHOD OF SUPERCONDUCTOR MAGNETIC FIELD APPLICATION APPARATUS, AND NUCLEAR MAGNETIC RESONANCE APPARATUS AND SUPERCONDUCTING MAGNET APPARATUS USING THE METHOD

BACKGROUND OF THE INVENTION

1. Field of the Invention

The present invention relates to apparatuses in which a superconductor is allowed to capture a magnetic field and used as a magnetic field generation source, such as a nuclear magnetic resonance apparatus, permanent magnet magnetization apparatus, magnetic field floating apparatus, electric motor, power generator, magnetic field separation apparatus, magnetic field press apparatus, ferromagnetic field generation apparatus, and flywheel power storage apparatus. The present invention particularly relates to a technology for controlling and stabilizing a generated magnetic field and a distribution of the field in desired sizes.

2. Description of Related Art

A nuclear magnetic resonance is a phenomenon seen in a magnetic system including a magnetic moment and angular momentum, and is a resonance phenomenon in a frequency (Larmor frequency) inherent in the magnetic system. For example, as shown in FIG. 1, a static magnetic field $H_o$ made by a magnet is applied to a sample, and a vibration magnetic field $H_i$ is further applied to the sample from a direction vertical to the static magnetic field via a transmission coil. At present, a pulse nuclear magnetic resonance (NMR) apparatus is a mainstream, in which a very short (3 to 6 $\mu s$) and strong high-frequency pulse is applied to the sample, and all signals spreading in a chemical shift are simultaneously resonated and simultaneously observed.

Moreover, in order to obtain a sectional image, magnetic fields whose strength differs with a position called a gradient magnetic field is superimposed onto the static magnetic field, and a position is identified by shifting a resonance frequency for each position. An image method of exciting (selectively exciting) a predetermined section only by a necessary thickness with a high frequency, subsequently applying the gradient magnetic field in two directions in the section, and obtaining the sectional image by a two-dimensional Fourier method is generally used.

The aforementioned nuclear magnetic resonance apparatus (hereinafter referred to as an NMR apparatus) utilizing the aforementioned nuclear magnetic resonance phenomenon is basically constituted of a magnet for forming the static magnetic field, a coil for generating another high-frequency pulse and detecting an NMR signal, a receiver for receiving the NMR signal, and the like. Data useful in analyzing a structure of an organic compound, such as a chemical shift amount of each atom and spin-spin coupling constant can be obtained by the NMR apparatus.

Moreover, a magnetic resonance imaging apparatus (hereinafter referred to as an MRI apparatus) utilizing the nuclear magnetic resonance phenomenon is constituted of: at least a magnet as static magnetic field generation means; gradient magnetic fields for applying position information to the signal; a high-frequency irradiation system; an NMR signal detection system; probe coils which surrounds a test object such as a human body and actually performs high-frequency irradiation and signal detection; and controllers for controlling these components and processing the obtained signal. A space distribution of a nuclide which generates the signal is visualized by the nuclear magnetic resonance (NMR) signal obtained by irradiating the test object disposed in the presence of the static magnetic field with the high frequency. Since the MRI apparatus does not use a ray, the apparatus is safe, a sufficient resolution is obtained, and a practical value is remarkably high.

On the other hand, as a method for magnetizing a bulk superconductor, a field cooling method and a pulse magnetizing method have heretofore been known.

The field cooling method (FC method) is general, and comprises applying a uniform external magnetic field to the superconductor to be magnetized by a superconducting magnet or the like using a superconducting coil at a temperature not less than a superconducting transition temperature. While the magnetic field is kept as it is, and the magnetic field exists inside the superconductor, the superconductor is cooled at a temperature lower than the superconducting transition temperature. When the external magnetic field is reduced at the kept temperature, the magnetic field tends to go out of the superconductor by a repulsive force of magnetic flux lines. However, when there is a portion for restraining the magnetic flux line in the superconductor, the magnetic flux line is pinned. Therefore, even when the external magnetic field turns to zero, and the magnetic field in a sample outer edge decreases to zero, the magnetic field remains in the superconductor. In this case, a superconducting current flows in a portion having a magnetic field gradient inside the superconductor, and a size of the current becomes equal to that of a critical current density Jc. According to the principle, when a sufficiently large external magnetic field is formed and the superconductor is magnetized, the magnetic field gradient is formed to a sample center. The superconductor is magnetized until a material property is obtained. Moreover, when the applied magnetic field is lower than the material property, the superconductor is magnetized to achieve the size of the applied magnetic field at maximum.

For the pulse magnetization, an apparatus therefor is simple. In the apparatus the superconductor to be magnetized is cooled at a temperature lower than the superconducting transition temperature. While the temperature is controlled and kept to be constant, the pulse magnetic field is applied. The magnetic flux line having penetrated the superconductor in a pulse magnetic field increase process is captured inside the superconductor by a pinning force in a magnetic field decrease process.

As the static magnetic field generating magnet constituting the nuclear magnetic resonance apparatus, a resistive magnet of 0.5 to 2.2 T, and a superconducting magnet of 0.5 to 18.8 T have heretofore been used, and a permanent magnet is also used in some case. The static magnetic field generating magnet of the nuclear magnetic resonance apparatus has an enhanced sensitivity for a ferromagnetic field, and enables analysis of a large amount of detailed information. Therefore, the superconducting magnet using a superconducting material is superior in the strength, stability and uniformity of the magnetic field.

Therefore, in the recent nuclear magnetic resonance apparatus, the superconducting magnet using a superconducting coil formed of a metal-based superconducting wire material such as niobium and titanium is used to form a main magnetic field (static magnetic field). However, when the superconducting coil is utilized, liquid helium is used to cool the coil at an extremely low temperature. This raises a problem that a large amount of expensive liquid helium is required and running cost is high.

Moreover, the metal-based superconducting wire material such as niobium and titanium is produced by a complicated manufacturing process and thermal treatment. Therefore, the superconducting coil is much more expensive than a usual electromagnet coil formed of a copper wire, and the apparatus main body becomes extremely expensive. Additionally, utilization of a refrigerant (liquid helium and liquid nitrogen) essential for operating the superconducting magnet requires a special technique, and is technically complicated and intricate. Therefore, it is difficult to handle that the utility is a simple technique. These big problems hinder a high-performance nuclear magnetic resonance apparatus from spreading.

Furthermore, since the superconducting magnet requires a large cooling structure, and a leak magnetic field is also huge, an exclusive room for installing the magnet is necessary. This remarkably limits an apparatus installation condition, and also limits an apparatus utilization field.

On the other hand, an example of a small and simple nuclear magnetic resonance apparatus is proposed in Japanese Patent Application Laid-Open No. 135823/1997, in which a direct cooling type superconducting magnet is used instead of the conventional helium cooling type superconducting magnet. This nuclear magnetic resonance apparatus is more convenient than the apparatus using the conventional helium cooling type superconducting magnet, but there is a problem that the remarkably expensive superconducting coil has to be used in forming the main magnetic field.

Moreover, since a refrigerator is used to cool the superconducting coil in a vacuum container, a coil portion becomes large-sized. In this case, the advantage that the apparatus is small-sized and convenient cannot sufficiently be utilized. Furthermore, since a heat capacity of the superconducting coil is large, a time necessary for cooling the coil at a predetermined temperature with the refrigerator is long. There is also a problem that a time from start of cooling until start of measurement is long.

To solve the aforementioned conventional problem, the present applicant of the present invention has developed and filed a prior application for the nuclear magnetic resonance apparatus in which the bulk magnet formed of a high-temperature superconductor is used (Japanese Patent Application Laid-Open No. 248810/1999). In this apparatus, a superconducting current flows through the high-temperature superconductor (bulk magnet) which is cooled in a vacuum insulating container and to which the magnetic field is applied. Then, the superconductor captures the magnetic field to constitute a magnetic field supply member, the magnetic field is used as the main magnetic field, and the NMR signal of a material to be measured disposed in the magnetic field is detected by a detection coil and spectrometer disposed adjacent to the material to be measured.

In the nuclear magnetic resonance apparatus, the superconducting current flows through the high-temperature superconductor (bulk magnet), the magnetic field is captured, and the magnetic field supply member is constituted. Therefore, a strong static magnetic field comparable to the conventional superconducting magnet can be formed without using the expensive liquid helium.

The density of the magnetic flux captured by the high-temperature superconductor (bulk magnet) becomes stronger at a lower temperature during capturing. However, even when the superconductor is once magnetized with a high magnetic flux density, a cooling temperature thereafter rises because of a drop of vacuum degree, the magnetic flux density then drops, and there is a problem in stability of the magnetic field.

Therefore, it is difficult to hold the magnetic flux density to be steadily constant, and there is a problem that a measurement precision in the nuclear magnetic resonance apparatus drops.

In other words, it is difficult to control a strength and distribution of the generated magnetic field after magnetization, and the stability of the magnetic field is unsatisfactory.

That is, in the FC method of cooling the superconductor in the magnetic field, when the magnetic field applied during magnetization is within a range of magnetization property of the superconductor to be magnetized, ideally the magnetic field having the same strength as that of the applied magnetic field must be captured. However, actually the magnetic field decays with time because of a phenomenon called a flux creep, the size of the applied magnetic field cannot be achieved by the magnetization. Moreover, in the magnetizing process of the FC method, even when the magnetic field strength in a position utilizing the magnetic field is measured, only a synthesized value of the superconductor to be magnetized with the applied external magnetic field can be measured. Therefore, an exact magnetic field captured by the single superconductor to be magnetized is unknown in the magnetizing process. Therefore, in the conventional FC method, the generated magnetic field of a superconductor magnetic field application apparatus cannot precisely be controlled.

Moreover, in the pulse magnetization, since heat is generated during magnetization, the material property cannot be achieved by the magnetization. Therefore, the drop of the magnetic field by the flux creep is little. However, since the method is strongly influenced by ununiformity of the material as compared with the FC method, a magnetic field distribution shape is easily distorted. Therefore, it is difficult to obtain an isotropic distribution of the generated magnetic field of the superconductor magnetic field application apparatus with less distortion. Moreover, since the value of the captured magnetic field after magnetization changes with a slight difference of a magnetization condition, a desired generated magnetic field cannot precisely be obtained during pulse magnetization. This is a big problem for the superconductor magnetic field application apparatus in which precision is required in the generated magnetic field value and distribution, particularly for the nuclear magnetic resonance apparatus.

SUMMARY OF THE INVENTION

The present invention has been developed to solve the problem. That is, an object of the present invention is to provide a controlling method of a magnetic field application apparatus and nuclear magnetic resonance apparatus which can form a strong static magnetic field comparable to a conventional superconducting magnet without using a refrigerant (liquid helium) essential for operating the conventional superconducting magnet, and which can hold a magnetic flux density of the static magnetic field to be constant steadily for a long time.

According to the present invention, there is provided a controlling method of a superconductor magnetic field application apparatus in which a static magnetic field is generated by a high-temperature superconductor (20) positioned in a vacuum insulating container (22), the method comprising: a magnetizing step (A) for cooling the high-temperature superconductor at a magnetization low temperature sufficiently lower than a superconductor transition temperature, and magnetizing the high-temperature superconductor with the magnetic field; a magnetic flux setting step (B) for raising the temperature of the high-temperature superconductor at a magnetic flux setting temperature higher than the magnetization low temperature and lower than the superconductor transition temperature and setting a predetermined magnetic flux density; and an operation controlling step (C) for controlling the high-temperature superconductor in an operation temperature range lower than the magnetic flux setting temperature.

According to a preferred embodiment of the present invention, a maximum magnetic field larger than the magnetic field generated in the apparatus is captured by the superconductor in the magnetizing step. In the magnetic flux setting step, a magnetic field strength is measured in a position requiring the magnetic field, and the temperature of the superconductor is raised until the strength is lowered to a predetermined strength of the magnetic field. At the same time the strength of the magnetic field of the superconductor drops to the predetermined strength, or when a desired strength is estimated, the temperature is lowered again, and the step shifts to the operation controlling step.

According to the method of the present invention, the magnetic field can precisely be set by the magnetic flux setting step. By this step, while the magnetic field of the predetermined position is actually measured, the strength can also be controlled to achieve the desired strength. The magnetic field excessively captured beforehand in the magnetizing step may be decreased to achieve the desired strength by slowly raising the temperature while measuring the magnetic field of the predetermined position. At the same time the generated magnetic field obtains the desired strength in the predetermined place, the superconductor is quickly cooled, and subsequently held at the low temperature. By this operation controlling step, an influence of decay of the magnetic field can substantially be removed, and a stable magnetic field strength can be obtained. After the temperature rise, the superconductor cannot quickly be cooled because of the size or the like of the high-temperature superconductor, and a delay occurs. In this case, the cooling of the superconductor may also be started by estimating beforehand that the desired strength is obtained.

When the magnetic field in the actually usable place is measured and simultaneously the magnetic field is controlled in this manner, the magnetic field strength can be controlled with a sufficient precision even by the apparatus such as the nuclear magnetic resonance apparatus requiring the magnetic field strength in accordance with a resonance frequency.

Moreover, since the high-temperature superconductor (20) generates the static magnetic field, the strong static magnetic field comparable to the conventional superconducting magnet can be formed without using a refrigerant (liquid helium) essential for operating the conventional superconducting magnet.

Furthermore, a heater for partially raising the temperature of the superconductor is disposed, and a temperature distribution is formed in the superconductor. For example, the heater is partially disposed in a middle portion of the surface of the high-temperature superconductor, only the middle portion is temporarily heated instead of the hole high-temperature superconductor, and thereby the captured magnetic field only of the middle portion can be decreased. According to this method, the magnetic field distribution generated in the superconductor can be set to a desired distribution (e.g., a truncated conical shape in which only the middle portion is flat).

Furthermore, the high-temperature superconductor (20) is an oxide superconductor whose main component is represented by RE-Ba—Cu—O. The superconductor contains 0 to 50% of at least one of silver, platinum and cerium, and RE is synthesized by at least one of yttrium (element symbol: Y), samarium (Sm), lanthanum (La), neodymium (Nd), europium (Eu), gadolinium (Gd), erbium (Er), ytterbium (Yb), dysprosium (Dy), and holmium (Ho). Moreover, a structure is included in which a superconducting phase having a superconducting transition temperature of 90 K to 96 K in terms of an absolute temperature and an allotrope insulating phase disposed inside the superconducting phase are dispersed with a particle size of 50 $\mu$m or less, preferably 10 $\mu$m or less.

The yttrium-based, neodymium-based, samarium-based, and other high-temperature superconductors having the superconducting transition temperature Tc of 90 Kelvin (K) or more in terms of the absolute temperature are synthesized in a so-called melting method of heating and melting the materials once at a temperature higher than a melting point, and coagulating the materials again. Then, a molded material with a rough and large grown crystal is obtained, and this is called the superconducting bulk. A structure in which the insulating phase is finely dispersed is obtained in a superconducting parent phase, a pinned point attributed to the presence of the dispersed phase captures a magnetic flux, and the superconducting bulk serves as a pseudo permanent magnet.

The superconducting bulk synthesized by the melting method has the superconducting transition temperature of 90K to 96K in terms of the absolute temperature, and includes a structure in which a large crystal formed of the superconducting phase with a size of 1 mm to 100 mm, and the allotrope insulating phase disposed inside the large crystal are dispersed with a particle size of 50 $\mu$m or less (preferably 10 $\mu$m or less).

When the allotrope insulating phase dispersed in the structure is 50 $\mu$m or less during synthesis of the high-temperature superconductor, a satisfactory magnetic field capture property appears, a 0.5 T class magnetic field is generated, and the high-temperature superconductor can be used in the present invention. In a certain system to which platinum and cerium are added, the insulating phase can be controlled to be 10 $\mu$m or less. In this case, the magnetic field having an extremely excellent property of 1 T class or a higher class or several T can be captured, and the present invention can highly be utilized. Moreover, in a system to which 0 to 50% of silver is added, a crack easily introduced in a synthesis stage or a use stage is prevented from being generated or propagated, and a large-sized high-temperature superconductor can advantageously and soundly be synthesized and used.

The magnetic field of the high-temperature superconductor can be magnetized by the static magnetic field. When the strong static magnetic field is generated by the conventional metal-based superconducting coil, and the magnetic field is captured by the high-temperature superconductor, the high-temperature superconductor can be magnetized by the strong static magnetic field able to be generated by the metal-based superconducting coil.

The high-temperature superconductor may also be magnetized by a pulse magnetic field. When a large magnetic field is momentarily generated in the coil to magnetize the high-temperature superconductor, the high-temperature superconductor can more easily be magnetized.

Furthermore, it is preferable to cool the high-temperature superconductor at a temperature lower than the superconducting transition temperature in a refrigerant, by a cooling portion of a refrigerator, or by the refrigerant cooled by the refrigerator. As the refrigerator, a pulse tube refrigerator, GM cycle refrigerator, Solvay cycle refrigerator, Stirling cycle refrigerator, and Peltier refrigerator are preferably used alone or as a combination of two or more thereof.

As the refrigerant, a gas, liquid, or solid (excluding helium) of nitrogen, oxygen, argon, helium, neon, hydrogen, or the like can be used. This can easily cool the high-temperature superconductor at a temperature which is lower than the superconducting transition temperature (e.g., about 90K).

In a structure for cooling the high-temperature superconductor, copper or another metal, or an alumina single crystal or another heat transfer material directly contacts and cools the high-temperature superconductor, and the metal or the heat transfer material is cooled by the refrigerants such as liquid nitrogen or the aforementioned various refrigerators.

In another structure, the high-temperature superconductor is cooled by the liquid, gas or solid refrigerant such as liquid nitrogen, liquid helium, and solid nitrogen gas which is cooled by the refrigerator. In this case, since the superconductor is separated from the refrigerator, a mechanical influence of the refrigerator can be cut off, and measurement precision can be enhanced.

Other objects and advantageous characteristics of the present invention will be apparent from the following description with reference to the accompanying drawings.

DETAILED DESCRIPTION OF THE PREFERRED EMBODIMENTS

Figure 1:
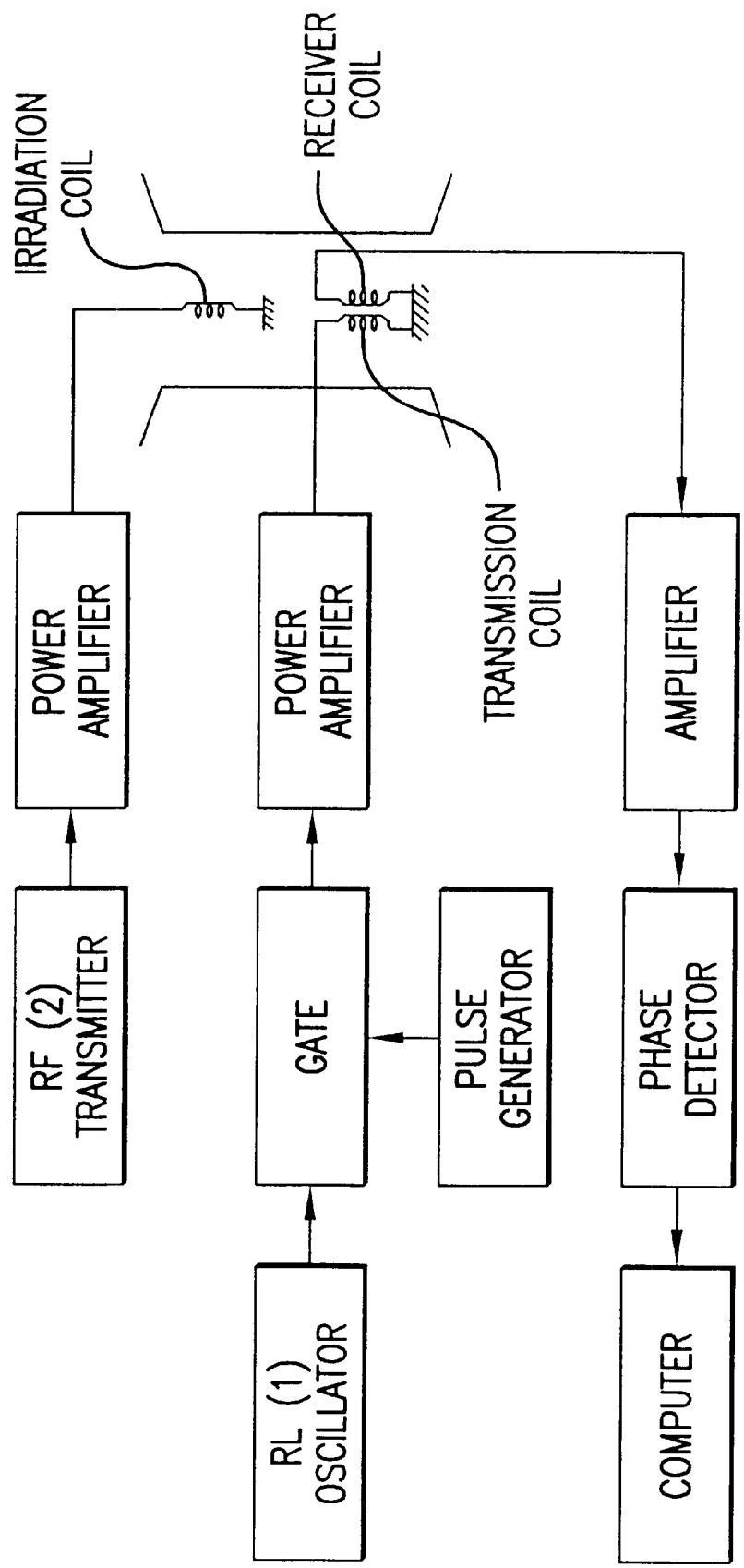
FIG. 1 is a principle diagram of a pulse FTNMR.

A preferred embodiment of the present invention will be described hereinafter with reference to the drawings by way of an example for use in a nuclear magnetic resonance apparatus. Common portions in the respective drawings are denoted with the same reference numerals, and redundant description will be omitted.

Figure 2:
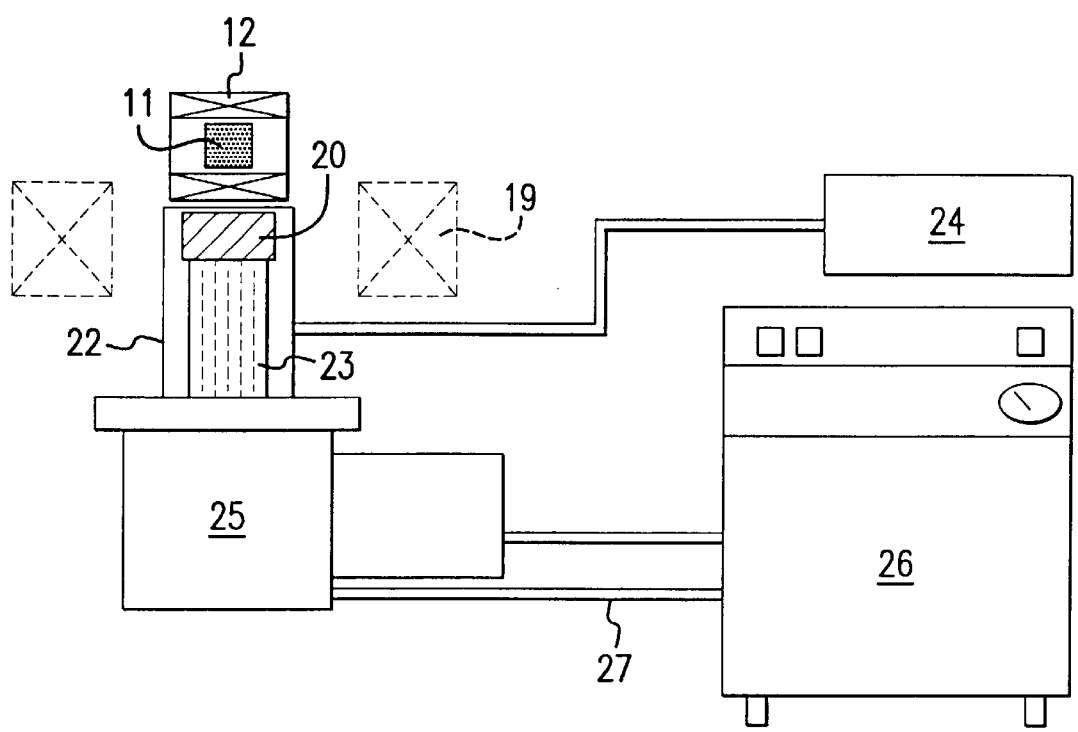
FIG. 2 is a general configuration of a superconductor magnetic field application apparatus (nuclear magnetic resonance apparatus) to which a method of the present invention is applied.

FIG. 2 is a general configuration of the nuclear magnetic resonance apparatus to which a method of the present invention is applied.

In FIG. 2, a material 11 to be measured is disposed inside a detection coil 12 wound around the material. A pulse is applied to the material to be measured via a transmission coil from a high-frequency oscillator, GATE portion for shaping a pulse, and power amplifier for amplifying the high-frequency pulse. A free induction decay (FID) signal generated immediately after the pulse is received by a receiver coil, the pulse is transmitted through the subsequent amplifier and phase detector, and an AD converted signal is stored in the computer. The data is subjected to Fourier transform, and an analysis result of NMR is displayed on the computer, or information mapped as MRI is obtained.

In the present invention, a high-temperature superconductor 20 is cooled at a temperature lower than a superconductor transition temperature in a vacuum insulating container 22, and the material 11 to be measured is inserted into a static magnetic field of the high-temperature superconductor 20. The detection coil 12 is wound/disposed to detect an NMR signal.

According to the constitution, a superconducting current is generated centering on a shaft center of the high-temperature superconductor 20 to magnetize the superconductor. This generates a strong static magnetic field in the vicinity of the high-temperature superconductor 20, and the NMR signal of the material to be measured disposed in the magnetic field is detected by the detection coil and a spectrometer.

The superconducting bulk 20 is cooled at the temperature lower than the superconductor transition temperature in liquid nitrogen or by a cooling portion of a refrigerator. A small-sized refrigerator is mainly used as the refrigerator. One of a pulse tube refrigerator, GM cycle refrigerator, Solvay cycle refrigerator, and Stirling cycle refrigerator is used. The superconducting bulk is cooled without an intricate operation of a refrigerant (liquid helium and liquid nitrogen). Thereafter, the superconducting bulk is magnetized by a pulse magnetic field, and functions as a superconducting permanent magnet. The bulk may also be magnetized by applying a static magnetic field to the bulk and simultaneously cooling the bulk at the temperature lower than the superconductor transition temperature. The superconducting bulk magnetized in this manner generates the magnetic field from the vacuum container, the material to be measured is disposed in the magnetic field, and the magnetic field is applied to the material to be measured. The coil is disposed around and in the vicinity of the material to be measured, and the NMR signal is detected via an oscillation detector.

In FIG. 2, the high-temperature superconductor 20 is disposed in the vacuum insulating container 22, brought to contact with a cooling portion 23 (cold head) of the refrigerator, and fixed. A vacuum pump 24 reduces a pressure of the vacuum insulating container 22 and brings the container to an insulating state. A refrigerator 25 and compressor 26 are operated to lower the temperature of the high-temperature superconductor 20 and to bring the superconductor to a superconducting state.

In a controlling method of the nuclear magnetic resonance apparatus of the present invention, the magnetic field of the high-temperature superconductor 20 can be magnetized by the static magnetic field. That is, the superconducting bulk 20 in the vacuum insulating container 22 is cooled. During or after cooling, a strong static magnetic field is generated by a conventional metal-based superconducting coil 19, and the bulk magnet 20 is disposed in the magnetic field. While the magnetic field is applied to the bulk during cooling, the bulk is allowed to capture the magnetic field. After the magnetization, the metal-based superconducting coil 19 is demagnetized and removed. Since a temperature rise of the high-temperature superconductor 20 during magnetization can be avoided by the magnetization (field cool) by the static magnetic field, the high-temperature superconductor 20 can capture a very strong static magnetic field.

The magnetic field of the high-temperature superconductor 20 may also be magnetized by a pulse magnetic field. According to this method (pulse magnetizing method), the bulk magnet can be magnetized by momentarily generating a large magnetic field in the coil 19. The method is superior in stability of the magnetic field as compared with the magnetizing method by the static magnetic field. Because the magnetization can easily be performed with a simple and easy apparatus and the magnetized magnet can be held at a lower temperature.

Figure 3:
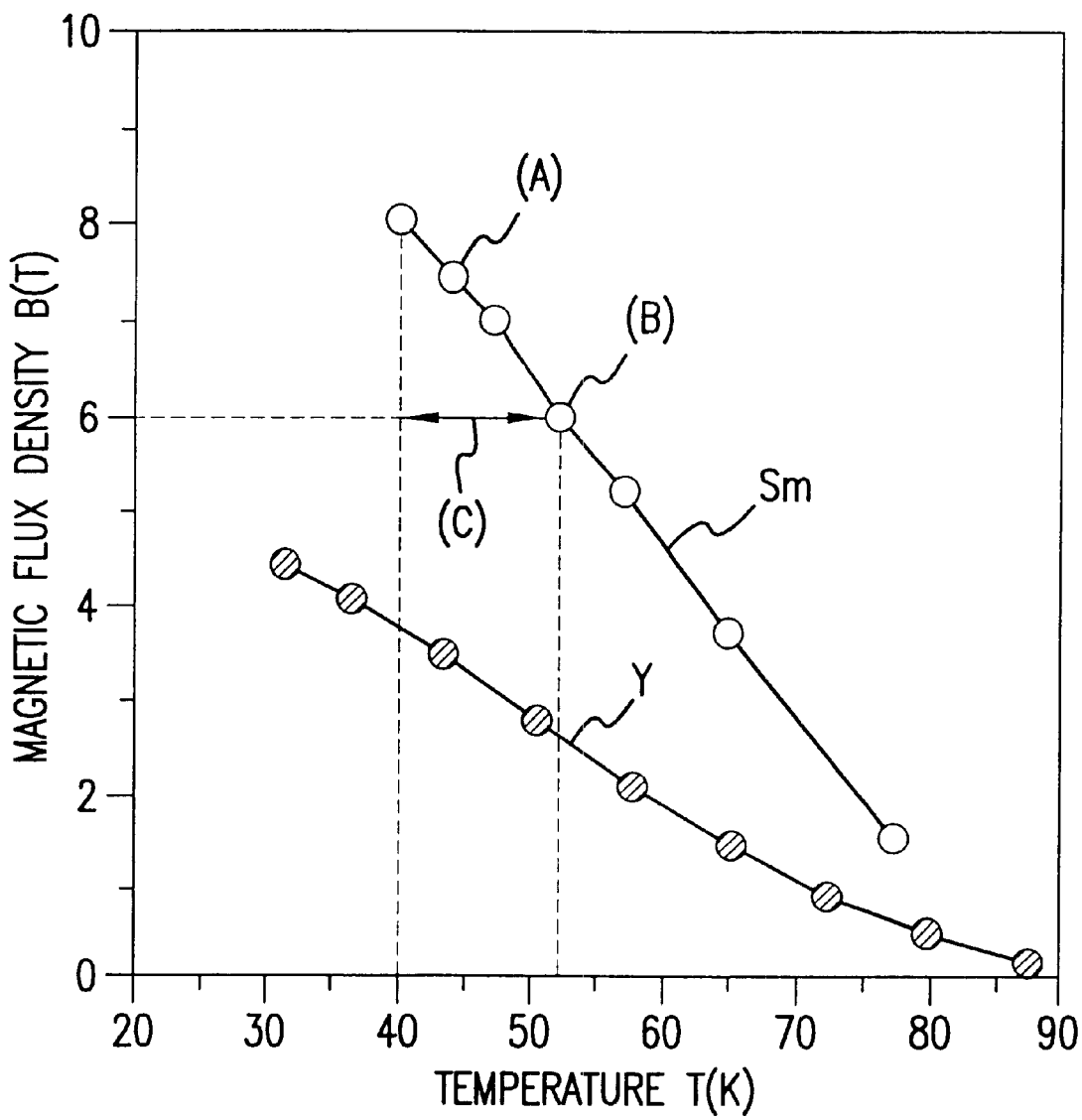
FIG. 3 is a graph showing a dependence of a captured magnetic field of a high-temperature superconductor on temperatures.

FIG. 3 is a graph showing a dependence of the captured magnetic field on temperature in magnetization by the static magnetic field of the high-temperature superconductor. In FIG. 3, the abscissa indicates a cooling temperature of the high-temperature superconductor, and the ordinate indicates a captured magnetic flux density. Moreover, in FIG. 3, an upper line corresponds to use of a samarium (Sm) based superconductor as the high-temperature superconductor, and a lower line corresponds to use of a yttrium (Y) based superconductor.

As clearly seen from the drawings, when the high-temperature superconductor is cooled at the temperature sufficiently lower than the superconductor transition temperature, the strong static magnetic field comparable to the conventional superconducting magnet can be formed by the magnetization (field cool) by the static magnetic field and the pulse magnetizing method.

However, even when the superconductor is once magnetized with the high magnetic flux density as described above, the cooling temperature thereafter rises because of a drop of vacuum degree, and the magnetic flux density then drops. Therefore, it is difficult to actually hold the magnetic flux density to be steadily constant for a long time, and measurement precision of the nuclear magnetic resonance apparatus gradually drops.

Figure 4:
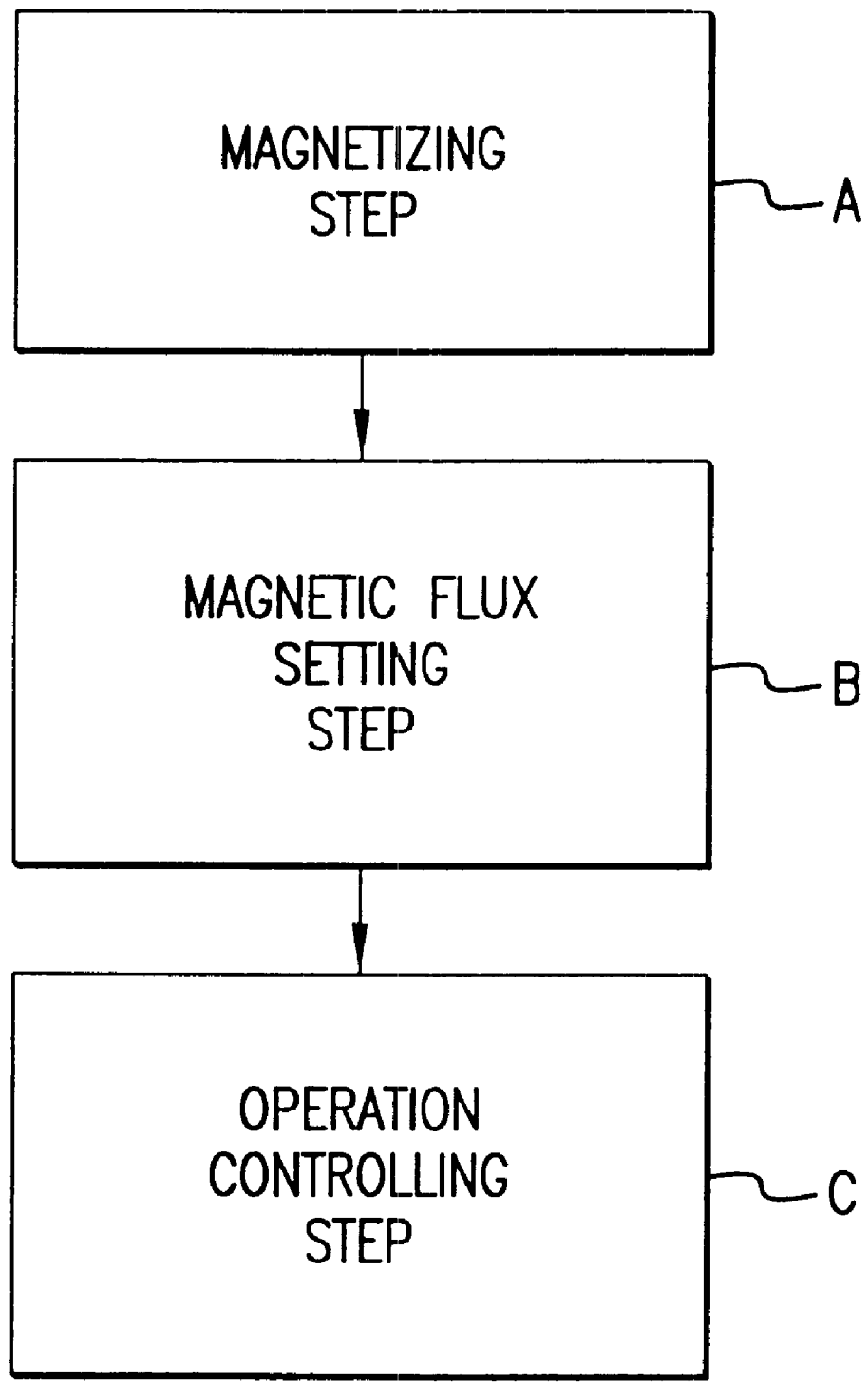
FIG. 4 is a control flowchart of the superconductor magnetic field application apparatus according to the present invention.

FIG. 4 is a control flowchart of the nuclear magnetic resonance apparatus according to the present invention. As shown in FIG. 4, according to the present invention, there is provided a controlling method of the nuclear magnetic resonance apparatus in which the static magnetic field is generated by the high-temperature superconductor 20 positioned in the vacuum insulating container 22. The method comprises a magnetizing step (A), magnetic flux setting step (B) and an operation controlling step (C). The respective steps (A), (B), (C) will be described for samarium (Sm) of FIG. 3.

In the magnetizing step (A), the high-temperature superconductor 20 is cooled at a temperature sufficiently lower than a superconductor transition temperature, and the high-temperature superconductor is magnetized. With samarium (Sm), when the superconductor is cooled at 40K, the superconductor can be magnetized with the magnetic field of about 8 T. Additionally, with a predetermined magnetic flux density of, for example, 6 T for use, the superconductor may be cooled at a sufficient low temperature (e.g., about 45K) at which the magnetic field can be magnetized.

Subsequently, in the magnetic flux setting step (B), the temperature of the high-temperature superconductor 20 is raised at a magnetic flux setting temperature (about 52K in this example) which is higher than the magnetization temperature (e.g., about 45K) and lower than the superconductor transition temperature (about 90K) and a predetermined magnetic flux density (6 T) is set.

Finally, in the operation controlling step (C), the high-temperature superconductor 20 is controlled in an operation temperature range lower than the magnetic flux setting temperature. In this case, the lower limit of the operation temperature range is better, and the superconductor may be cooled at 40K which is lower than the magnetization temperature (e.g., about 45K).

Figure 5:
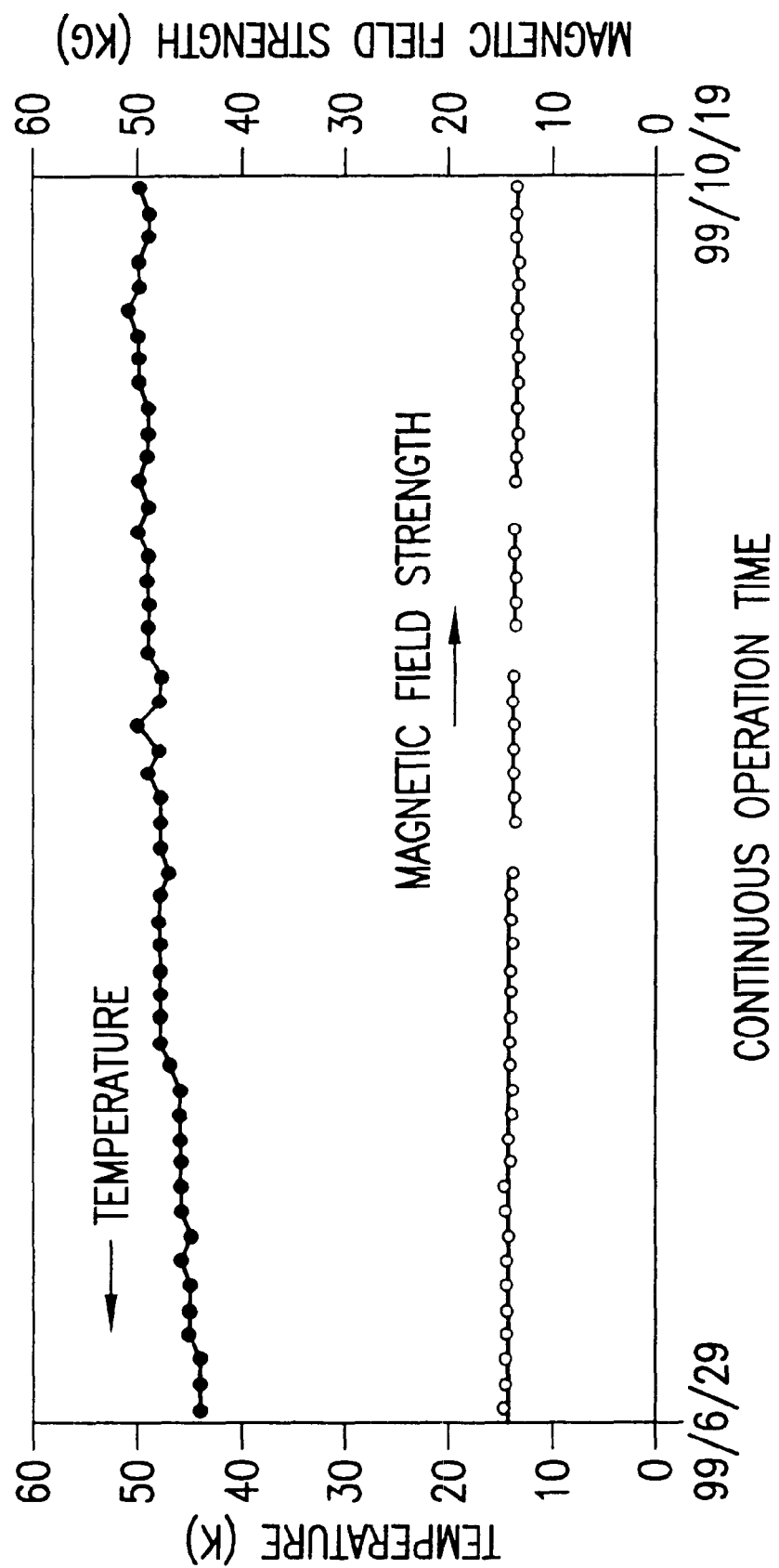
FIG. 5 is a graph showing an embodiment of the present invention.

FIG. 5 is a graph showing the embodiment of the present invention. In FIG. 5, the abscissa indicates a continuous operation time of about four months, and the ordinate indicates changes of a surface temperature and magnetic field strength of the high-temperature superconductor.

As seen from FIG. 5, according to the method of the present invention, even when the surface temperature of the high-temperature superconductor changes to 51K from about 45K because of a change of vacuum degree, the magnetic field strength can be held to be constant.

Figure 6:
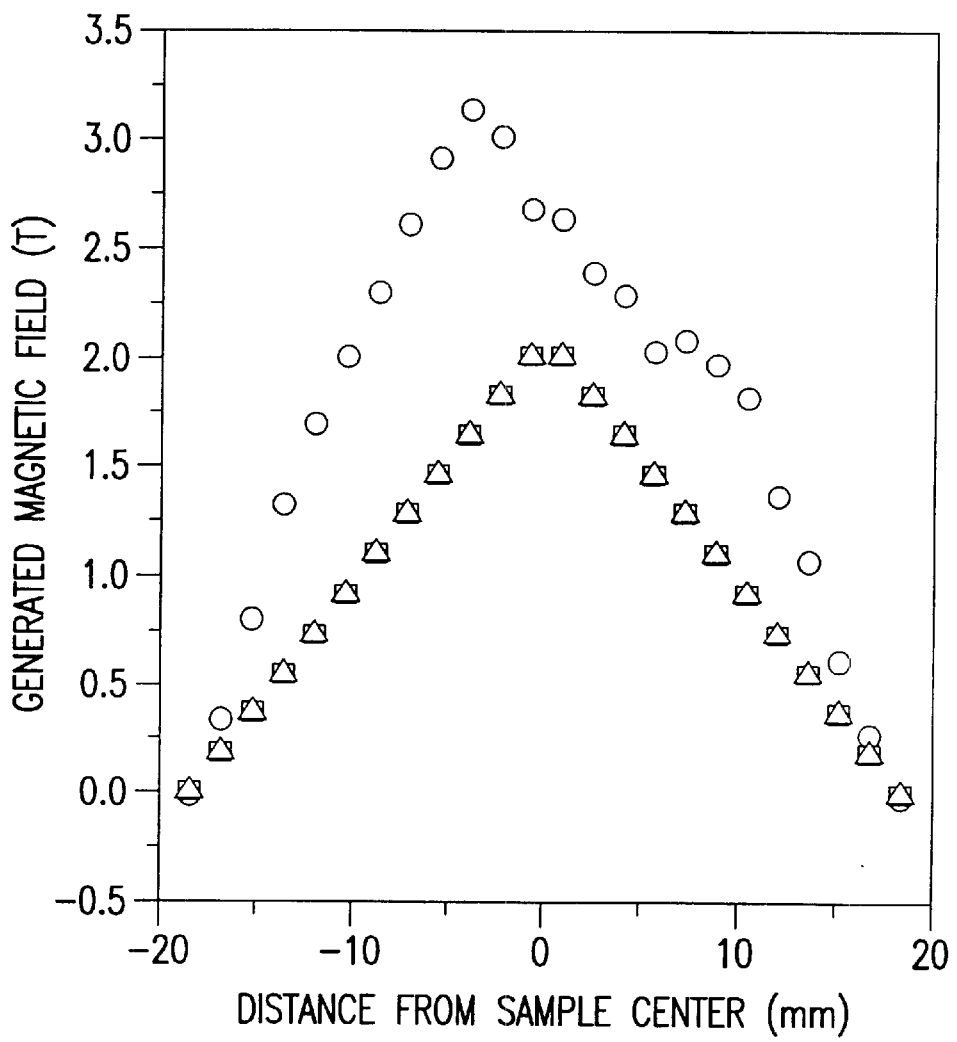
FIG. 6 is a graph showing a captured magnetic field distribution in the embodiment of the present invention.

FIG. 6 is a graph showing a captured magnetic field distribution in the embodiment of the present invention. In FIG. 6, the abscissa indicates a distance from a sample center, and the ordinate indicates a generated magnetic field. Moreover, in FIG. 6, (A) marked by circles indicates the distribution immediately after the magnetizing step (A) of the present invention, (B) marked by triangles indicates the distribution immediately after the magnetic flux setting step (B), and (C) marked by squares indicates the distribution of two days after the operation controlling step (C).

As shown in FIG. 6, in the magnetizing step (A) in which the superconductor is magnetized by pulse magnetization, the captured magnetic field distribution is obtained as shown in FIG. 6 (A), and the distribution is distorted. However, in the subsequent magnetic flux setting step (B), the magnetic field is controlled, so that an isotropic distribution is obtained as shown in FIG. 6 (B). Furthermore, even in the operation controlling step (C), as shown in FIG. 6 (C), the strength and distribution of the magnetic field do not change from the state of FIG. 6 (B) which is set in the magnetic flux setting step (B), and are stabilized.

Moreover, when a heater or another heat source for partially raising the temperature of the superconductor is disposed, and a temperature distribution is formed in the superconductor, a desired (e.g., flat) magnetic field distribution can be generated in the superconductor. The heater or another heat source may directly or indirectly contact the superconductor. Alternatively, the superconductor may be irradiated with a laser beam, infrared ray, or the like via a transmission vacuum container.

According to the aforementioned method of the present invention, since the high-temperature superconductor is cooled at the temperature sufficiently lower than the superconductor transition temperature and magnetized in the magnetizing step (A), the high-temperature superconductor (bulk magnet) can be magnetized with a very strong magnetic flux density.

Moreover, in the magnetic flux setting step (B), the temperature of the high-temperature superconductor is raised at the magnetic flux setting temperature which is higher than the magnetization temperature and lower than the superconductor transition temperature, and the predetermined magnetic flux density is set. Therefore, the maximum magnetic flux density of the magnetization in the magnetizing step is slightly lowered, and the desired magnetic flux density can freely be set.

Furthermore, in the operation controlling step (C), the high-temperature superconductor is controlled in the operation temperature range lower than the magnetic flux setting temperature. Therefore, even when the temperature fluctuates in the temperature range lower than the temperature in the magnetic flux setting step because of the drop of the vacuum degree, and the like, the magnetic field of the high-temperature superconductor does not fluctuate, and the magnetic flux density can be held to be constant.

Moreover, since the high-temperature superconductor (20) generates the static magnetic field, the strong static magnetic field comparable to the conventional superconducting magnet can be formed without using the refrigerant (liquid helium) essential for operating the conventional superconducting magnet.

Furthermore, when the superconductor is magnetized with the pulse magnetic field, symmetry of the captured magnetic field distribution is sometimes unsatisfactory. However, the captured magnetic field is slightly decreased and controlled in the method of the present invention. Therefore, the distribution becomes more isotropic, and the stable magnetic field distribution and strength can be obtained.

Therefore, according to the method of the present invention, the strong static magnetic field comparable to the conventional superconducting magnet can be formed without using the refrigerant (liquid helium) essential for operating the conventional superconducting magnet. Moreover, the magnetic flux density of the static magnetic field can be held to be steadily constant for a long time, and other superior effects are produced.

Additionally, the present invention is not limited to the aforementioned embodiment, and can of course freely be changed within the scope of the present invention. For example, even in the superconducting magnet apparatus for magnetizing the permanent magnet, the high-temperature superconductor used in a floating magnet of a magnetic floating train, and the like, the desired magnetic field needs to be steadily generated in the desired place. Therefore, the method of the present invention is very effective.

What is claimed is:

1. A controlling method of a superconductor magnetic field application apparatus in which a static magnetic field is generated by a high-temperature superconductor (20) positioned in a vacuum insulating container (22), the method comprising:
    a magnetizing step (A) for cooling the high-temperature superconductor at a magnetization low temperature sufficiently lower than a superconductor transition temperature, and magnetizing the high-temperature superconductor with the magnetic field;
    a magnetic flux setting step (B) for raising the temperature of the high-temperature superconductor at a magnetic flux setting temperature higher than said magnetization low temperature and lower than said superconductor transition temperature and setting a predetermined magnetic flux density; and
    an operation controlling step (C) for controlling the high-temperature superconductor in an operation temperature range lower than said magnetic flux setting temperature.

2. The controlling method of the superconductor magnetic field application apparatus according to claim 1, further comprising steps:
    allowing the superconductor to capture a maximum magnetic field larger than the magnetic field to be generated in the apparatus in said magnetizing step (A);
    measuring a magnetic field strength in a position requiring the magnetic field, and raising the temperature of said superconductor until the magnetic field drops to a predetermined magnetic field in said magnetic flux setting step (B); and
    lowering the temperature again and shifting to said operation controlling step (C) at the same time the magnetic field of said superconductor drops to the predetermined strength, or when a desired strength is estimated.

3. The controlling method of the superconductor magnetic field application apparatus according to claim 2 wherein the magnetic field of the high-temperature superconductor is magnetized by the static magnetic field.

4. The controlling method of the superconductor magnetic field application apparatus according to claim 2 wherein the magnetic field of the high-temperature superconductor is magnetized by a pulse magnetic field.

5. A superconducting magnet apparatus using the controlling method of the superconductor magnetic field application apparatus according to claim 2.

6. The nuclear magnetic resonance apparatus according to claim 5 wherein as the refrigerator, a pulse tube refrigerator, a GM cycle refrigerator, a Solvay cycle refrigerator, a Stirling cycle refrigerator, and a Peltier refrigerator are used alone or as a combination of two or more thereof.

7. The nuclear magnetic resonance apparatus according claim 2 wherein said high-temperature superconductor (20) is an oxide superconductor whose main component is represented by RE-Ba—Cu—), and contains 0 to 50% of at least one of silver, platinum and cerium, RE is synthesized of at least one of yttrium (element symbol: Y), samarium (Sm), lanthanum (La), neodymium (Nd), europium (Eu), gadolinium (Gd), erbium (Er), ytterbium (Yb), dysprosium (Dy), and holmium (Ho).

8. The nuclear magnetic resonance apparatus according to claim 7 wherein said high-temperature superconductor (20) includes a structure in which a superconducting phase having a superconducting transition temperature of 90 K to 96 K in terms of an absolute temperature and an allotrope insulating phase disposed inside the superconducting phase are dispersed with a particle size of 50 $\mu$m or less, preferably 10 $\mu$m or less.

9. A nuclear magnetic resonance apparatus using the controlling method of the superconductor magnetic field application apparatus according to claim 2.

10. The controlling method of the superconductor magnetic field application apparatus according to claim 1, wherein a heater for partially raising the temperature of said superconductor is disposed, and a temperature distribution is formed in the superconductor.

11. The nuclear magnetic resonance apparatus according claim 10 wherein said high-temperature superconductor (20) is an oxide superconductor whose main component is represented by RE-Ba—Cu—O, and contains 0 to 50% of at least one of silver, platinum and cerium, RE is synthesized of at least one of yttrium (element symbol: Y), samarium (Sm), lanthanum (La), neodymium (Nd), europium (Eu), gadolinium (Gd), erbium (Er), ytterbium (Yb), dysprosium (Dy), and holmium (Ho).

12. The nuclear magnetic resonance apparatus according to claim 11 wherein said high-temperature superconductor (20) includes a structure in which a superconducting phase having a superconducting transition temperature of 90 K to 96 K in terms of an absolute temperature and an allotrope insulating phase disposed inside the superconducting phase are dispersed with a particle size of 50 $\mu$m or less, preferably 10 $\mu$m or less.

13. A nuclear magnetic resonance apparatus using the controlling method of the superconductor magnetic field application apparatus according to claim 10.

14. A superconducting magnet apparatus using the controlling method of the superconductor magnetic field application apparatus according to claim 10.

15. The nuclear magnetic resonance apparatus according to claim 14 wherein as the refrigerator, a pulse tube refrigerator, a GM cycle refrigerator, a Solvay cycle refrigerator, a Stirling cycle refrigerator, and a Peltier refrigerator are used alone or as a combination of two or more thereof.

16. The nuclear magnetic resonance apparatus according to claim 1 wherein said high-temperature superconductor (20) is an oxide superconductor whose main component is represented by RE-Ba—Cu—O, and contains 0 to 50% of at least one of silver, platinum and cerium, RE is synthesized of at least one of yttrium (element symbol: Y), samarium (Sm), lanthanum (La), neodymium (Nd), europium (Eu), gadolinium (Gd), erbium (Er), ytterbium (Yb), dysprosium (Dy), and holmium (Ho).

17. The nuclear magnetic resonance apparatus according to claim 16 wherein said high-temperature superconductor (20) includes a structure in which a superconducting phase having a superconducting transition temperature of 90 K to 96 K in terms of an absolute temperature and an allotrope insulating phase disposed inside the superconducting phase are dispersed with a particle size of 50 $\mu$m or less, preferably 10 $\mu$m or less.

18. A nuclear magnetic resonance apparatus using the controlling method of the superconductor magnetic field application apparatus according to claim 1.

19. The nuclear magnetic resonance apparatus according to claim 18 wherein as the refrigerator, a pulse tube refrigerator, a GM cycle refrigerator, a Solvay cycle refrigerator, a Stirling cycle refrigerator, and a Peltier refrigerator are used alone or as a combination of two or more thereof.

20. A superconducting magnet apparatus using the controlling method of the superconductor magnetic field application apparatus according to claim 1.

21. The controlling method of the superconductor magnetic field application apparatus according to claim 2 wherein said high-temperature superconductor is cooled at a temperature lower than a superconducting transition temperature in a refrigerant, by a cooling portion of a refrigerator, or by the refrigerant cooled by the refrigerator.

* * * * *